United States Patent
Xie

(10) Patent No.: US 8,808,514 B2
(45) Date of Patent: Aug. 19, 2014

(54) MAGNETRON SPUTTERING APPARATUS

(75) Inventor: Zhenyu Xie, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 190 days.

(21) Appl. No.: 13/380,103

(22) PCT Filed: Apr. 21, 2011

(86) PCT No.: PCT/CN2011/073127
§ 371 (c)(1),
(2), (4) Date: Dec. 22, 2011

(87) PCT Pub. No.: WO2011/131137
PCT Pub. Date: Oct. 27, 2011

(65) Prior Publication Data
US 2012/0090991 A1 Apr. 19, 2012

(30) Foreign Application Priority Data
Apr. 21, 2010 (CN) .................. 2010 2 0171400 U

(51) Int. Cl.
*C23C 14/35* (2006.01)
(52) U.S. Cl.
USPC ............ 204/298.25; 204/298.12; 204/298.23; 204/298.26; 204/298.06
(58) Field of Classification Search
USPC ............. 204/298.12, 298.23, 298.25, 298.26, 204/298.06
See application file for complete search history.

(56) References Cited

U.S. PATENT DOCUMENTS

| | | | |
|---|---|---|---|
| 4,465,575 A * | 8/1984 | Love et al. | 204/192.26 |
| 5,429,729 A * | 7/1995 | Kamei et al. | 204/192.12 |
| 2001/0001413 A1* | 5/2001 | Deornellas et al. | 156/345 |

FOREIGN PATENT DOCUMENTS

| | | |
|---|---|---|
| CN | 1308689 A | 8/2001 |
| CN | 201326029 Y | 10/2009 |
| CN | 201648509 U | 11/2010 |
| EP | 1054438 A2 | 11/2000 |
| JP | 2006219687 A | 8/2006 |

OTHER PUBLICATIONS

International Search Repot; mailed Jul. 28, 2011; PCT/CN2011/073127.
International Preliminary Report on Patentability issued Oct. 23, 2012; PCT/CN2011/073127.

* cited by examiner

*Primary Examiner* — Keith Hendricks
*Assistant Examiner* — Jason M Berman
(74) *Attorney, Agent, or Firm* — Ladas & Parry LLP

(57) ABSTRACT

A magnetron sputtering apparatus comprising: a deposition chamber; a processing chamber in communication with the deposition chamber, wherein a target area composed of targets is located at the place where the processing chamber is connected with the deposition chamber; a transfer chamber provided adjacent to the processing chamber, wherein a first gas-tight gate is provided on a wall of the transfer chamber, the first gas-tight gate being opened or closed so as to control the vacuum degree in the transfer chamber and to replace the targets; a transfer device which is provided in the processing chamber and/or the transfer chamber, transfers the target between the transfer chamber and the processing chamber via a second gas-tight gate provided on the adjacent walls of the transfer chamber and the processing chamber for replacement when the transfer chamber is in a set vacuum degree state.

14 Claims, 4 Drawing Sheets

MAGNETRON SPUTTERING APPARATUS

TECHNICAL FIELD

The present invention relates to a magnetron sputtering apparatus.

BACKGROUND

Magnetron sputtering technique is a common technology for depositing a thin film, and plays an important role in the preparation procedure of a liquid-crystal display (LCD).

FIG. 1 and FIG. 2 are structural schematic views of two types of typical magnetron sputtering apparatus in the related technology, each of the magnetron sputtering apparatus includes a deposition chamber 1, in which are oppositely provided a target and a substrate mount 3, and on the substrate mount 3 is placed a substrate 4 to be deposited with a thin film. The difference is in that the magnetron sputtering apparatus in FIG. 1 adopts a planar target 22, while the magnetron sputtering apparatus in FIG. 2 adopts a rotational target 21. Each target and the substrate mount 3 form a cathode and an anode respectively, between which an electric field and a magnetic field can be formed. On a wall of the deposition chamber 1 is provided with a gas inlet (Gas In) 5 and a gas suction outlet 6; the gas inlet 5 is used to feed working gas such as argon or the like into the deposition chamber 1, and the gas suction outlet 6 is connected to an air suction pump so as to suck out the gas in the deposition chamber 1, in order to maintain the vacuum degree as well as to circulate and replace the working gas.

The operational principle of the magnetron sputtering apparatus is explained as follows. Electrons are accelerated to fly to the substrate under the action of the electric field and collide with argon atoms during this process so as to ionize to produce a large number of argon ions and electrons, which form a plasma area 13 between the target and the substrate. The argon ions are accelerated to bombard the target under the action of the electric field, sputtering out a large number of target atoms or molecules; the target atoms or molecules which are neutral are deposited on the substrate to form a film. In order to enable more argon ions to bombard the target so as to produce more target atoms or molecules, it is necessary to improve the collision frequency between the electrons and the argon atoms. In the process of the accelerated flight to the substrate of secondary electrons, because of the magnetic field formed near the target, the secondary electrons are confined within the plasma area 13 near the target under the effect of the Lorentz force of the magnetic field, and move around the target, increasing movement paths of the electrons, and thus improving the collision frequency between the electrons and the argon atoms, so that a large number of the argon ions produced by ionization can bombard out even more target atoms or molecules.

Under the effect of the distribution of the magnetic lines of the magnetic field, the formation of the argon ions is not uniform, resulting in a non-uniform consumption of material caused by the bombard of the target surface. The apparatus as shown in FIG. 1 adopts a stationary planar target 22, which will cause a situation in which the materials in partial positions have been depleted, while other positions have a lot of materials left. The non-uniformity of the surface materials of the planar target 22 directly causes the uniformity of the film formation to be poor. If the target is replaced at this point, it leads to a waste of material. The apparatus as shown in FIG. 2 adopts a plurality of rotational targets 21, and thus can replace the rotational target 21, the material of which hays been consumed up alone, so as to ensure a provision of targets with high uniformity in the deposition chamber 1.

Nevertheless, the existing rotational targets still have some defects. At the time of the target replacement, it is necessary to stop the magnetron sputtering depositing operation, the vacuum environment in the deposition chamber will be destroyed because of the target replacement, and it is necessary to conduct a vacuuming operation and charge working gas again after the target replacement. Thus, the magnetron sputtering apparatus which adopts the rotational targets in the related technology has the defects that target replacement is difficult, and the operation cost is high.

SUMMARY

According to an embodiment of the invention, there is provided a magnetron sputtering apparatus, which includes: a deposition chamber in which a substrate mount is provided; a processing chamber in communication with the deposition chamber, wherein a target area composed of targets is located at a place where the processing chamber is connected with the deposition chamber; a transfer chamber provided adjacent to the processing chamber, wherein a first gas-tight gate is provided on a wall of the transfer chamber, the first gas-tight gate is capable of being opened or closed so as to control the vacuum degree in the transfer chamber and to accommodate targets for replacement; a transfer device which is provided in the processing chamber or the transfer chamber, transfers the targets for replacement between the transfer chamber and the processing chamber via a second gas-tight gate provided on the adjacent walls of the transfer chamber and the processing chamber for replacement when the transfer chamber is in a set vacuum degree state.

DETAILED DESCRIPTION

In order to make the purposes, technical solutions and advantages of embodiments of the present invention more clear, the technical solutions in the embodiments of the present invention will be described clearly and completely below, in conjunction with the accompany drawings of the embodiments of the present invention. Obviously, the embodiments described below are only a part of the embodiments of the present invention, instead of all the embodiments. Based on the embodiments in the present invention, other embodiments obtained by those of ordinary skill in the art without making creative work all belong to the technical scope of the present invention.

First Embodiment

Figure 1:
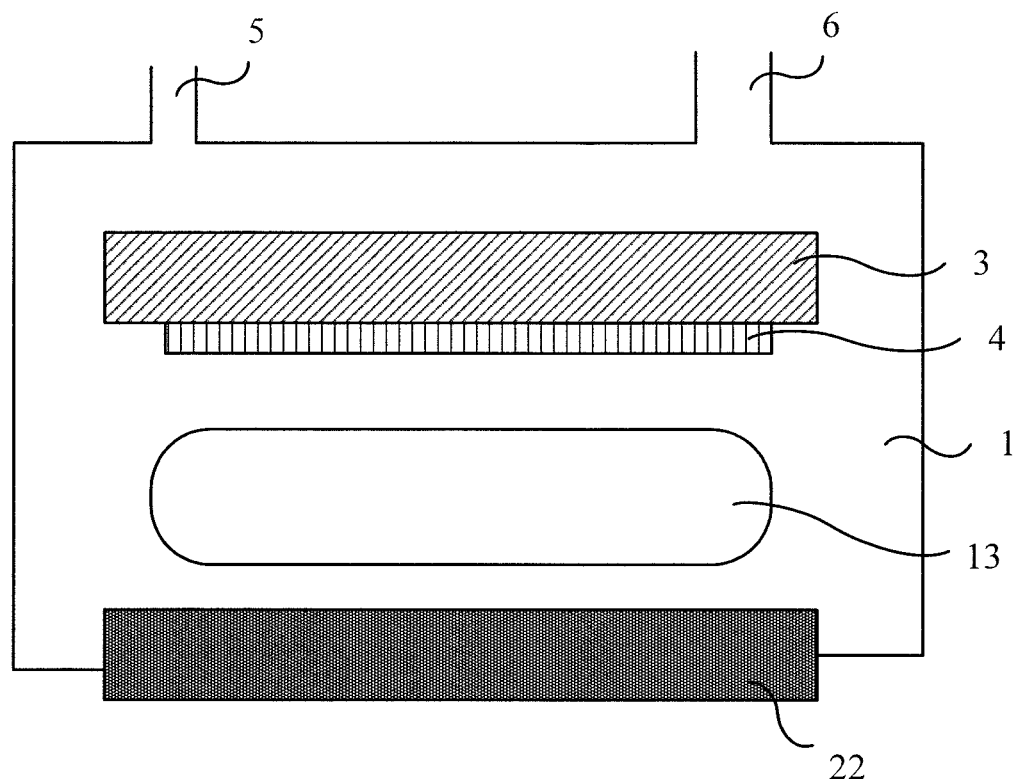
FIG. 1 is a structural schematic view of a typical magnetron sputtering apparatus adopting a planar target in the related technology.
Figure 2:
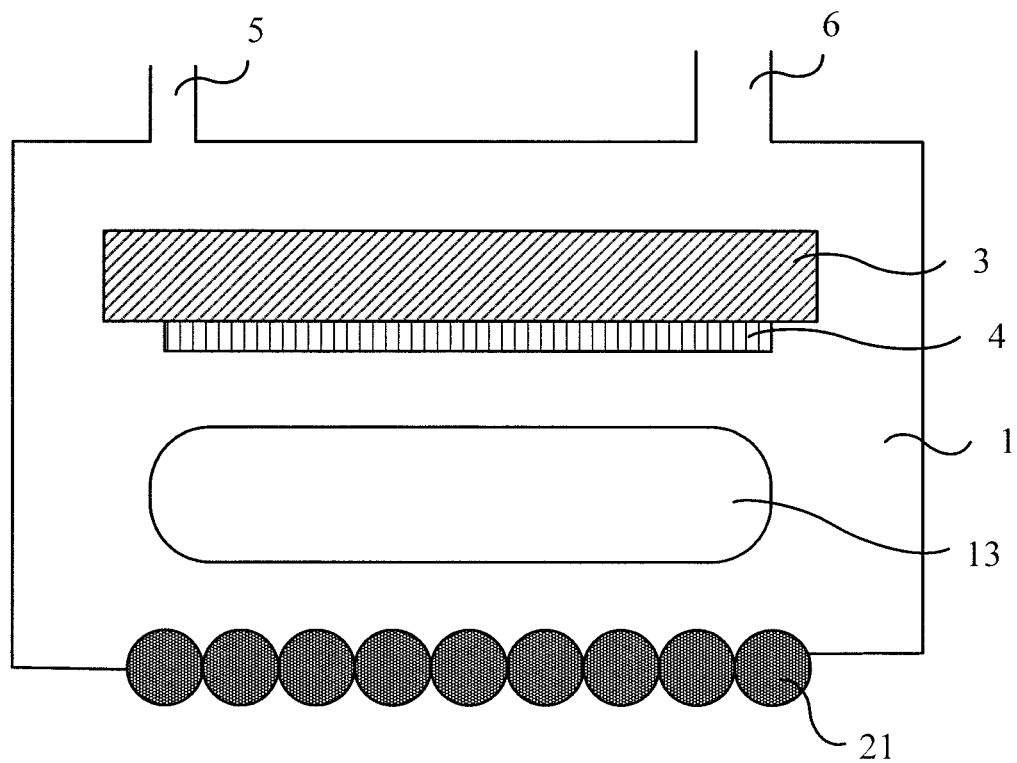
FIG. 2 is a structural schematic view of a typical magnetron sputtering apparatus adopting a rotational target in the related technology.
Figure 3:
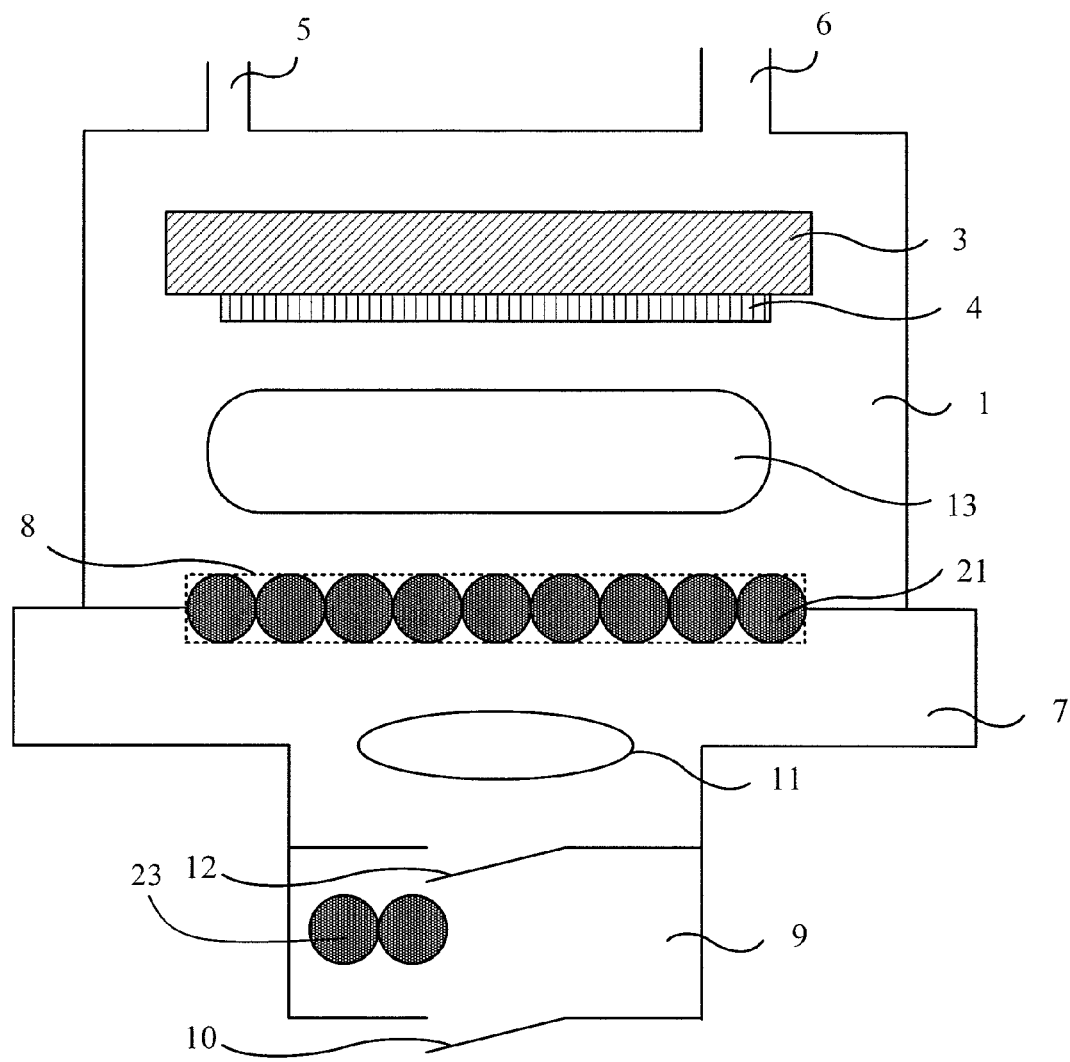
FIG. 3 is a structural schematic view of a magnetron sputtering apparatus provided in first embodiment of the present invention.

FIG. 3 is a structural schematic view of the magnetron sputtering apparatus provided in the first embodiment of the present invention. As shown in FIG. 3, the magnetron sputtering apparatus includes a deposition chamber 1 in which a substrate mount 3 is provided, and the substrate mount 3 is for placement of a substrate 4 to be deposited with a thin film. The deposition chamber 1 may further be provided with a gas inlet 5 and a gas suction outlet 6; the gas inlet 5 is used to feed working gas such as argon or the like, and the gas suction outlet 6 is used to suck out the gas in the deposition chamber 1, in order to maintain the vacuum degree as well as to circulate and replace the working gas. The magnetron sputtering apparatus further includes a processing chamber 7, a transfer chamber 9, and a transfer device 11.

As shown in FIG. 3, the processing chamber 7 and the deposition chamber 1 are in communication with each other; a target area 8 composed of targets is located at the place where the processing chamber 7 connects the deposition chamber 1. In this embodiment, rotational targets 21 are taken as an example for explanation. The target area 8 and the substrate mount 3 are disposed oppositely, between which an electric field and a magnetic field are formed, and further a plasma area 13 is formed in a process of deposition. The transfer chamber 9 is provided adjacent to the processing chamber 7; a first gas-tight gate 10 is provided on a wall of the transfer chamber 9, and the first gas-tight gate 10 is opened or closed so as to control the vacuum degree in the transfer chamber 9 and for replacement of the targets. The targets for replacement 23 are stored in the transfer chamber 9. The transfer device 11 is provided in the processing chamber 7, may be a mechanical hand, and transfers the target for replacement 23 between the transfer chamber 9 and the processing chamber 7 via a second gas-tight gate 12 provided on the adjacent walls of the transfer chamber 9 and the processing chamber 7 for replacement of the rotational target 21 in a state in which the transfer chamber 9 is in a set vacuum degree.

Although the transfer device is provided in the processing chamber in this embodiment, in practice the transfer device may also be provided in the transfer chamber, or may be composed by the combination of components provided in the transfer chamber and the processing chamber.

The target area in this embodiment may be a single sheet of a planar target, or preferably the target area is formed by a combination of a plurality of planar targets or a plurality of spinnable rotational targets; the target area formed by the combination faces the deposition chamber, so as to provide target materials for the depositing operation of the deposition chamber. FIG. 3 shows a preferable case adopting rotational targets 21, which can improve the uniformity of the surface material consumption of the rotational targets 21 by the spin of the rotational targets 21.

With the technical solution of this embodiment, by the provision of the processing chamber 7 and the transfer chamber 9, a transitional vacuum environment is provided for the targets in replacement process. The targets 23 for replacement which have been transferred in from outside are first entered into the transfer chamber 9, and then the transfer chamber 9 is sucked into vacuum, and then the second gas-tight gate 12 between the transfer chamber 9 and the processing chamber 7 is opened, to allow the targets 23 to be replaced into the target area 8. The vacuum environment and the working gas environment in the deposition chamber 1 are essentially not affected in the process described above. At the time of the target replacement, the vacuuming operation is only needed to be performed with respect to the transfer chamber 9, instead of the deposition chamber 1. The volume of the transfer chamber 9 which only acts as a transitional space is much smaller than that of the deposition chamber 1. Therefore, the magnetron sputtering apparatus provided in this embodiment has an advantage of easily replacing targets, it is not necessary to extensively perform the vacuum sucking operation to the deposition chamber 1 in the process of replacement operation, and thus the cost and difficulty of the target replacement can be reduced.

As for the case in which the target area is composed of a plurality of targets, it is even possible to replace only one or several of the targets. The replacement operation performed under a vacuum condition does not affect the targets that are in use, and even does not need to stop the depositing operation, so the work efficiency can be improved. With regard to the magnetic field that is in use, it can be achieved by providing electrodes in the target area, or by electrifying the targets in the target area.

On the basis of this embodiment, the magnetron sputtering apparatus may further include a heating device, which is provided in the processing chamber and/or the transfer chamber to heat the targets to be replaced into the deposition chamber. With this technical solution, it is possible to preheat the targets to be replaced, so that the targets after replacement are more easily to be bombarded to produce target atoms or molecules, and can decrease the effect of the target replacement on the deposition process as much as possible.

Second Embodiment

Figure 4:
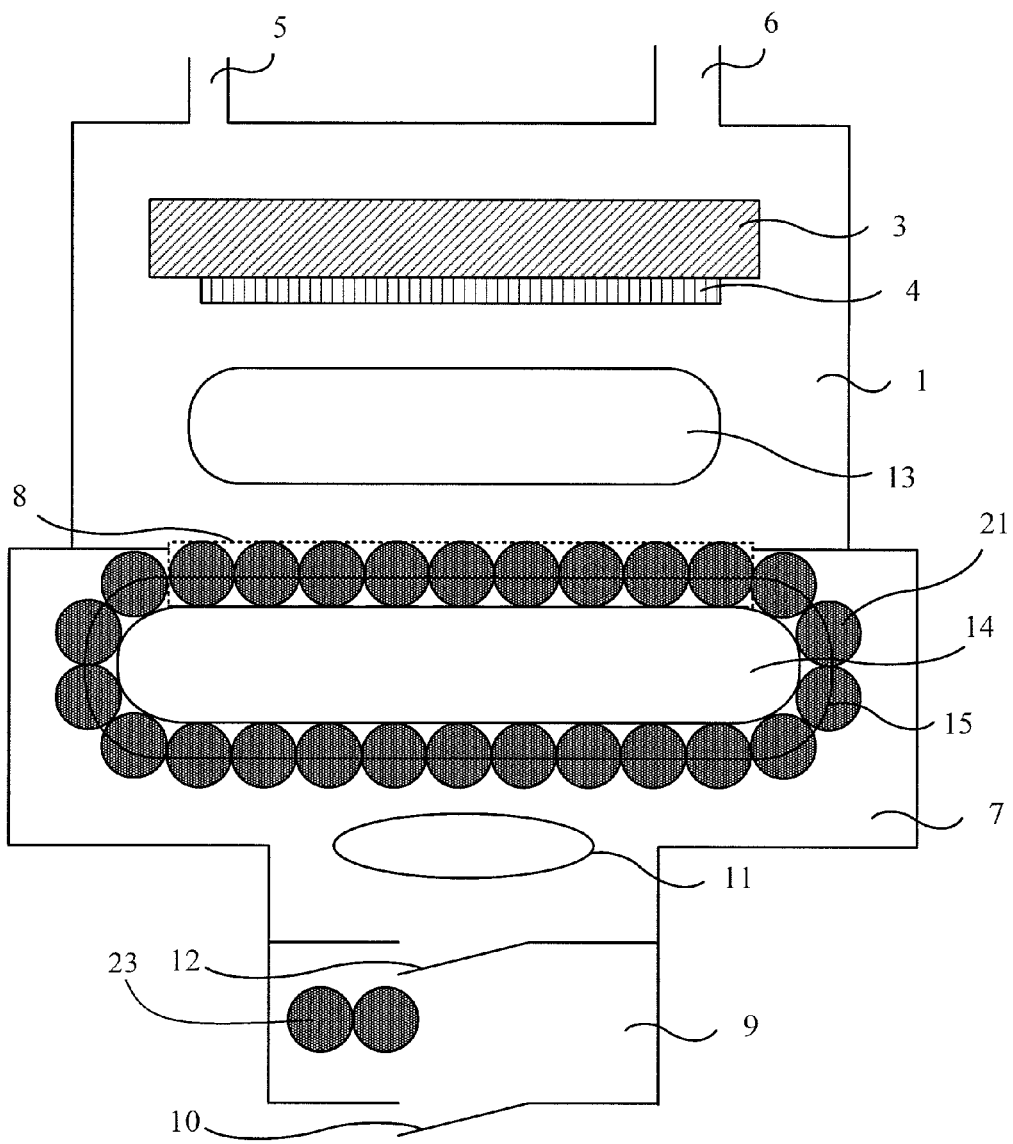
FIG. 4 is a structural schematic view of a magnetron sputtering apparatus provided in second embodiment of the present invention.

FIG. 4 is a structural schematic view of a magnetron sputtering apparatus provided in second embodiment of the present invention. As shown in FIG. 4, the magnetron sputtering apparatus further includes a moving base 14. The moving base 14 is provided at the connection point between the processing chamber 7 and the deposition chamber 1. A plurality of planar targets or rotational targets 21 are disposed on a driving rack 15 of the moving base 14. In this embodiment, the rotational targets 21 are taken as an example for explanation. The driving rack 15 transmits the rotational targets 21 to be replaced out of the target area 8, for replacement.

The technical solution of this embodiment allow the targets to be transmitted out of the target area 8 with the moving base 14. Because the target area 8 mainly is the area to provide target materials in the deposition process, the effect on the deposition process can be reduced by replacing targets outside the target area 8. By designing the structure at the connection point between the deposition chamber 1 and the processing chamber 7, as well as designing the structure of the moving base 14, the connection area between the deposition chamber 1 and the processing chamber 7 can be placed inside the target area 8.

In this embodiment, the orbital shape of the driving rack 15 is designed as an endless ring so as to allow the replaced targets 23 to be circularly replaced into the target area 8. In practical applications, the orbital shape of the driving rack 15 may also be an open curve, so as to allow the targets after replacement to be transmitted back to the target area 8. Alternatively, it can also be provided with two driving racks 15, so as to allow the targets to be transmitted alternately into the target area 8. The trajectory of the driving rack 15 may be designed according to specific requirements.

The operation process of the magnetron sputtering apparatus provided in this embodiment are as follows.

One aspect includes a process to place the standby rotational targets 21 onto the moving base 14, in particular: closing the second gas-tight gate 12, and opening the first gas-tight gate 10, at this point the transfer chamber 9 is in communication with the atmosphere, and reaches a pressure as same as the atmosphere; placing the standby rotational targets 23 into the transfer chamber 9; closing the first gas-tight gate 10, and performing vacuum suction or pumping for the transfer chamber 9, which can be performed through the first gas-tight gate 10 or other channels; opening the second gas-tight gate 12 after the gas pressure in the transfer chamber 9 reaches the same vacuum degree set in the processing chamber 7; taking the standby rotational targets 23 out of the transfer chamber 9 with the transfer device 11, and deploying them on the moving base 14, and then closing the second gas-tight gate 12.

Another aspect includes a process to take out the used rotational targets 21 from the processing chamber 7, in particular: closing the first gas-tight gate 10 and the second gas-tight gate 12, and performing vacuum suction for the transfer chamber 9; after the gas pressure in the transfer chamber 9 reaches the same vacuum degree set in the processing chamber 7, using the transfer device 11 to take out the used rotational targets 21 from the moving base 14, and placing the rotational targets 21 in the transfer chamber 9 having the set vacuum degree by opening the second gas-tight gate 12; closing the second gas-tight gate 12, opening the first gas-tight gate 10, and then taking out the used rotational targets 21 to the outside.

The above-described process of the target replacement only needs to perform vacuum suction operation for the transfer chamber, so the effect on the deposition process is reduced, the convenience for target replacement is improved, and the cost for replacement is reduced. With the technical solution of this embodiment, the problem of deposition speed and uniformity decreasing with the increasing time of use of the target can be avoided, and the efficiency of target replacement is improved.

Third Embodiment

Figure 5:
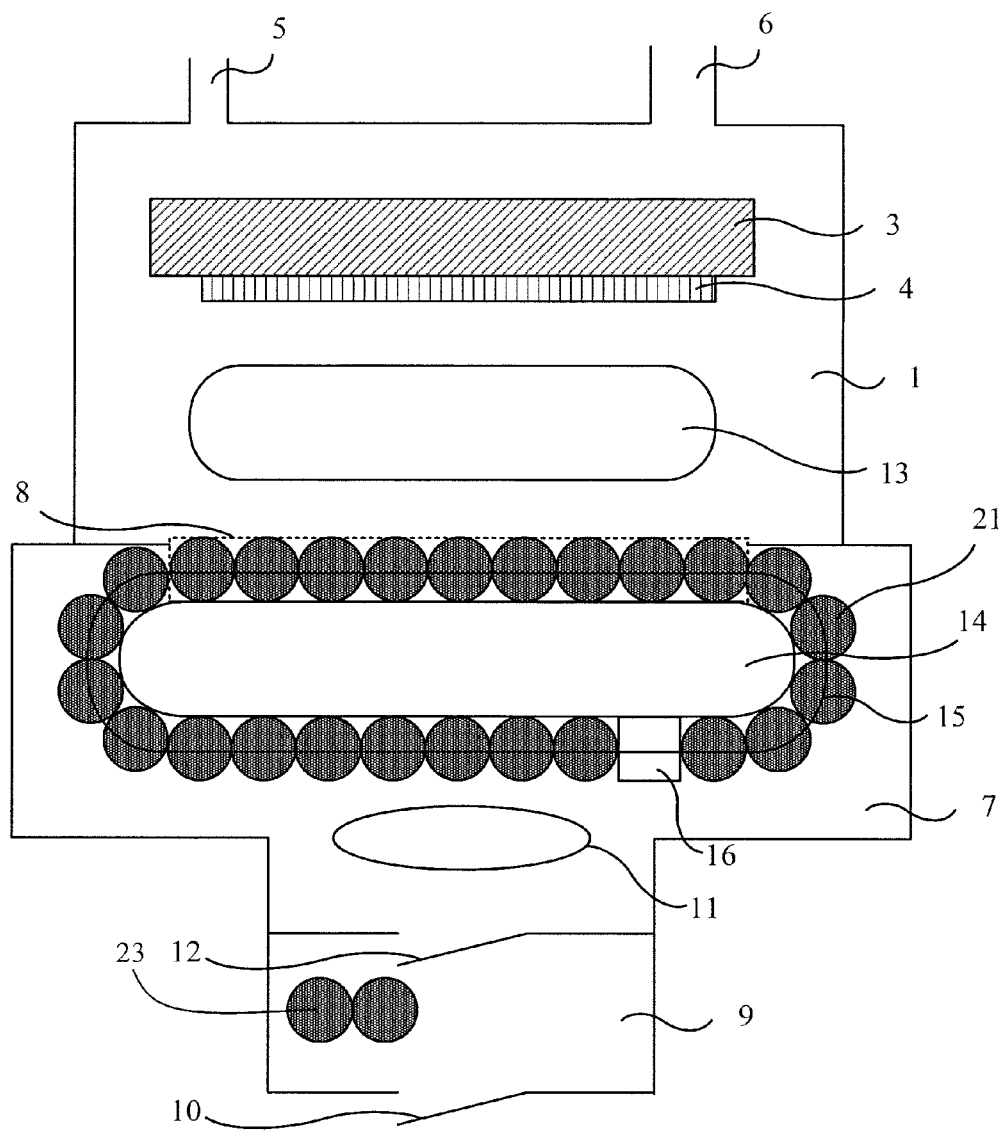
FIG. 5 is a structural schematic view of a magnetron sputtering apparatus provided in third embodiment of the present invention.

FIG. 5 is a structural schematic view of a magnetron sputtering apparatus provided in third embodiment of the present invention. As shown in FIG. 5, the magnetron sputtering apparatus further includes a gap adjustment apparatus 16. The gap adjustment apparatus 16 is provided in the path of the driving rack 15 transmitting the rotational targets 21 to be replaced, for adjustment of the gap between adjacent rotational targets 21.

Along with the progress of the film formation process, the material thickness of the rotational target 21 gradually becomes thinner, and the gap between the rotational targets 21 becomes greater, which severely affects the uniformity of the film formation. With the technical solution of this embodiment, this problem can be solved so that appropriately adjusting the gap between adjacent rotational targets 21 can allow the target area 8 to provide a more uniform target surface.

There are a plurality of ways to achieve the gap adjustment apparatus with a mechanical technique, an electrical technique or the like.

For example, an examplary implementation form of the gap adjustment apparatus may include a sensor and an adjustment assembly. The sensor is provided in the path of the driving rack transmitting the rotational targets to be replaced, for detecting the shortest gap between adjacent rotational targets, i.e., the gap between the surfaces of the rotational targets. The adjustment assembly is used to move the rotational target on the driving rack so as to reduce the gap between adjacent rotational targets when the sensor detected that the shortest distance is greater than a preset threshold value.

In the implementation manner described above, the sensor may determine the gap size by detecting the distance between the two surfaces of the objects, or may calculate the gap size and the remaining thickness of the rotational target by detecting the width of the target. One example is irradiating light rays from one side of the driving rack toward the other side, and receiving the light rays at the other side. The rotational targets are transmitted at a preset speed, and the gap size can be calculated according to the time amount of the light rays not being blocked by the rotational targets and the transmitting speed value. Or, the width of the rotational target can be calculated according to the time amount of the light rays being blocked and the transmitting speed value, to calculate the gap size indirectly. When the sensor detects that the shortest distance is greater than a preset threshold value, the rotational target can be moved by a preset distance according to the detected gap size by the adjustment assembly, thereby performing an accurate adjustment of the gap of the rotational target.

The form of the gap adjustment apparatus can be designed according to the deploying manner of the rotational target. In an examplary application, the rotation shaft of the rotational target can be fitted into a sliding groove that is used as the driving rack to realize transmitting, and the rotation shaft is fixed with a clamp. Accordingly, another examplary implementation manner of the gap adjustment apparatus may include: a clamp loosening component, a pushing component, and a clamp tightening component. The clamp loosening component is provided in the path of the driving rack transmitting the rotational target to be replaced, and used to loosen the clamp fixing the rotational target to the driving rack. The pushing component is used to push the rotational target of the loosened clamp in a direction toward the previous rotational target, until it attaches to a surface of the previous rotational target. The clamp tightening component is provided in the path of the driving rack transmitting the rotational target to be replaced, and used to screw and fix the clamp of the rotational target which has been pushed.

In the implementation manner described above, with regard to the rotational target that is passing the gap adjustment apparatus, first the clamp is loosened with the clamp loosening component, and since unfixed by the clamp, the rotational target together with the clamp can move freely in the sliding groove. An electric component or an elastic component can be used as the pushing component, to push the rotational target in the direction toward the previous rotational target, so as to be close to the previous rotational target. Thereafter, the clamp is fixed again, to complete the adjustment of the gap.

The implementation manners of the gap adjustment apparatus are not limited to the two types described above, and can be any manner as long as the distance between two adjacent targets is automatically adjusted to an appropriate position according to the use conditions of the targets.

The magnetron sputtering apparatus of above-described embodiment of the present invention may also be provided with or connected to a movement control device. The movement control device is used to control the movement of the driving rack of the moving base in the deposition process or in the interval between the deposition processes according to a preset rule, so as to transmit the targets.

The preset rule for transmitting the targets need to comply with actual operation conditions, matching the consumption speed and the replacement time of the targets. For example, the time when the targets are consumed to a certain degree can be determined according to experience, and the time is regarded as a preset period, thus every set period the targets currently in the target area is transferred out of the target area for replacement. Or, one or more targets can be transferred out of the target area according to other set periods, to replace the targets in the target area partially, thereby circularly updating the targets in the target area. Or, the targets are transmitted out of the target area according to a set rule, to regulate the gap between adjacent targets, and then send them into the target area to perform depositing operation.

With the technical solution described above, a full automation of the target replacement process can be achieved, achieving a high degree of automatic design.

Lastly, it should be noted that: the embodiments above are only used to illustrate the technical solutions of the present invention, and not to limit them. Although the present invention is described in detail with reference to the above described embodiments, those with ordinary skill in the art should appreciate that: the technical solutions described in each of the above embodiments can be modified, or a part of the technical features of them can be replaced equivalently, without departing form the spirit and scope of the technical solutions in the embodiments.

What is claimed is:

1. A magnetron sputtering apparatus, comprising:
    a deposition chamber in which a substrate mount is provided;
    a processing chamber in communication with the deposition chamber, wherein a target area composed of targets is located at a place where the processing chamber is connected with the deposition chamber;
    a transfer chamber provided adjacent to the processing chamber, wherein a first gas-tight gate is provided on a wall of the transfer chamber, the first gas-tight gate is capable of being opened or closed so as to control the vacuum degree in the transfer chamber and to accommodate targets for replacement;
    a transfer device which is provided in the processing chamber or in the transfer chamber, transfers the targets for replacement between the transfer chamber and the processing chamber via a second gas-tight gate provided on the adjacent walls of the transfer chamber and the processing chamber for replacement when the transfer chamber is in a set vacuum degree state;
    wherein the target area is formed by the combination of a plurality of planar targets or a plurality of rotational targets,
    a moving base provided at a connection point between the processing chamber and the deposition chamber, wherein the plurality of targets are deployed on a driving rack of the moving base, and the driving rack transmits the targets to be replaced out of the target area for replacement; and
    a gap adjustment apparatus provided in the path of the driving rack transmitting the targets to be replaced, for adjustment of the gap between adjacent targets.

2. The magnetron sputtering apparatus according to claim 1, further comprising:
    a heating device, which is provided in the processing chamber and/or the transfer chamber to heat the targets to be replaced into the deposition chamber.

3. The magnetron sputtering apparatus according to claim 2, further includes:
    a moving base provided at a connection point between the processing chamber and the deposition chamber, wherein the plurality of targets are deployed on a driving rack of the moving base, and the driving rack transmits the targets to be replaced out of the target area for replacement.

4. The magnetron sputtering apparatus according to claim 1, wherein the orbital shape of the driving rack is in an endless ring.

5. The magnetron sputtering apparatus according to claim 3, wherein the orbital shape of the driving rack is in an endless ring.

6. A magnetron sputtering apparatus, comprising:
    a deposition chamber in which a substrate mount is provided;
    a processing chamber in communication with the deposition chamber, wherein a target area composed of targets is located at a place where the processing chamber is connected with the deposition chamber;
    a transfer chamber provided adjacent to the processing chamber, wherein a first gas-tight gate is provided on a wall of the transfer chamber, the first gas-tight gate is capable of being opened or closed so as to control the vacuum degree in the transfer chamber and to accommodate targets for replacement;
    a transfer device which is provided in the processing chamber or in the transfer chamber, transfers the targets for replacement between the transfer chamber and the processing chamber via a second gas-tight gate provided on the adjacent walls of the transfer chamber and the processing chamber for replacement when the transfer chamber is in a set vacuum degree state;
    a heating device, which is provided in the processing chamber and/or the transfer chamber to heat the targets to be replaced into the deposition chamber;
    a moving base provided at a connection point between the processing chamber and the deposition chamber, wherein the plurality of targets are deployed on a driving rack of the moving base, and the driving rack transmits the targets to be replaced out of the target area for replacement; and
    a gap adjustment apparatus provided in the path of the driving rack transmitting the targets to be replaced, for adjustment of the gap between adjacent targets.

7. The magnetron sputtering apparatus according to claim 1, wherein the gap adjustment apparatus includes:
    a sensor provided in the path of the driving rack transmitting the targets to be replaced, for detecting of the shortest distance between adjacent targets; and
    an adjustment assembly used to move the targets on the driving rack so as to reduce the gap between adjacent targets when the sensor detected that the shortest distance is greater than a set threshold value.

8. The magnetron sputtering apparatus according to claim 6, wherein the gap adjustment apparatus includes:
    a sensor provided in the path of the driving rack transmitting the targets to be replaced, for detecting of the shortest distance between adjacent targets; and
    an adjustment assembly used to move the targets on the driving rack so as to reduce the gap between adjacent targets when the sensor detected that the shortest distance is greater than a set threshold value.

9. The magnetron sputtering apparatus according to claim 1, wherein the gap adjustment apparatus includes:
    a clamp loosening component provided in the path of the driving rack transmitting the targets to be replaced, and used to loosen the clamp fixing the targets to the driving rack;

a pushing component used to push the target in the loosened clamp in a direction toward the previous target until it attaches to a surface of the previous target; and a clamp tightening component provided in the path of the driving rack transmitting the target to be replaced, and used to screw and fix the clamp of the target which has been pushed.

10. The magnetron sputtering apparatus according to claim 6, wherein the gap adjustment apparatus includes:

a clamp loosening component provided in the path of the driving rack transmitting the targets to be replaced, and used to loosen the clamp fixing the targets to the driving rack;

a pushing component used to push the target in the loosened clamp in a direction toward the previous target, until it attaches to a surface of the previous target; and a clamp tightening component provided in the path of the driving rack transmitting the target to be replaced, and used to screw and fix the clamp of the target which has been pushed.

11. The magnetron sputtering apparatus according to claim 1, further comprising:

a movement control device used to control the movement of the driving rack of the moving base in a deposition process or in an interval between the deposition processes in a time period according to a set rule, so as to transmit the targets.

12. The magnetron sputtering apparatus according to claim 3, further includes:

a movement control device used to control the movement of the driving rack of the moving base in a deposition process or in an interval between the deposition processes in a time period according to a set rule, so as to transmit the targets.

13. The magnetron sputtering apparatus according to claim 3, wherein the gap adjustment apparatus includes:

a sensor provided in the path of the driving rack transmitting the targets to be replaced, for detecting of the shortest distance between adjacent targets; and an adjustment assembly used to move the targets on the driving rack so as to reduce the gap between adjacent targets when the sensor detected that the shortest distance is greater than a set threshold value.

14. The magnetron sputtering apparatus according to claim 3, wherein the gap adjustment apparatus includes:

a clamp loosening component provided in the path of the driving rack transmitting the targets to be replaced, and used to loosen the clamp fixing the targets to the driving rack;

a pushing component used to push the target in the loosened clamp in a direction toward the previous target, until it attaches to a surface of the previous target; and a clamp tightening component provided in the path of the driving rack transmitting the target to be replaced, and used to screw and fix the clamp of the target which has been pushed.

* * * * *